(12) United States Patent
You et al.

(10) Patent No.: US 12,295,102 B1
(45) Date of Patent: May 6, 2025

(54) FAR FIELD INTERFERENCE CANCELLATION FOR RESISTIVE-INDUCTIVE-CAPACITIVE SENSORS

(71) Applicant: Cirrus Logic International Semiconductor Ltd., Edinburgh (GB)

(72) Inventors: Zhong You, Austin, TX (US); Emmanuel Marchais, Dripping Springs, TX (US); Robert G. Kratsas, Austin, TX (US); Anthony S. Doy, Los Gatos, CA (US)

(73) Assignee: Cirrus Logic Inc., Austin, TX (US)

( * ) Notice: Subject to any disclaimer, the term of this patent is extended or adjusted under 35 U.S.C. 154(b) by 1820 days.

(21) Appl. No.: 16/299,648

(22) Filed: Mar. 12, 2019

Related U.S. Application Data (60) Provisional application No. 62/739,970, filed on Oct. 2, 2018, provisional application No. 62/721,134, filed
(Continued)

(51) Int. Cl.
*H05K 1/16* (2006.01)
*G01N 27/02* (2006.01)
(Continued)

(52) U.S. Cl.
CPC ............. *H05K 1/16* (2013.01); *G01N 27/023* (2013.01); *G01R 27/26* (2013.01); *H01F 5/003* (2013.01);
(Continued)

(58) Field of Classification Search
CPC ........... H05K 1/16; H05K 2201/10151; G01N 27/023; G01R 27/26; H01F 5/003; H03M 1/181
See application file for complete search history.

(56) References Cited

U.S. PATENT DOCUMENTS 4,268,822 A 5/1981 Olsen
4,888,554 A 12/1989 Hyde et al.
(Continued)

FOREIGN PATENT DOCUMENTS

CN 10542884 A 3/2016
CN 106471708 A 3/2017
(Continued)

OTHER PUBLICATIONS

International Search Report and Written Opinion of the International Searching Authority, International Application No. PCT/US2019/045554, mailed Oct. 17, 2019.
(Continued)

*Primary Examiner* — Judy Nguyen
*Assistant Examiner* — Adam S Clarke
(74) *Attorney, Agent, or Firm* — Jackson Walker L.L.P.

(57) ABSTRACT

A method may include forming an inductor comprising a plurality of inductor coils comprising a plurality of first inductor coils and a plurality of second inductor coils, each inductor coil comprising a spiraling wire of electrically-conductive material wherein the wire of electrically-conductive material is arranged substantially in a plane, wherein the plurality of first inductor coils and the plurality of second inductor coils are electrically coupled to one another and arranged with respect to one another such that within the plane, electrical current flowing through the inductor flows clockwise in the first inductor coils, within the plane, electrical current flowing through the inductor flows counterclockwise in the second inductor coils, each first inductor coil is adjacent to at least one second inductor coil, and each second inductor coil is adjacent to at least one first inductor coil.

17 Claims, 5 Drawing Sheets

Related U.S. Application Data on Aug. 22, 2018, provisional application No. 62/649,857, filed on Mar. 29, 2018, provisional application No. 62/649,870, filed on Mar. 29, 2018.

(51) Int. Cl.
  *G01R 27/26* (2006.01)
  *H01F 5/00* (2006.01)
  *H03M 1/18* (2006.01)

(52) U.S. Cl.
  CPC .. *H03M 1/181* (2013.01); *H05K 2201/10151* (2013.01)

(56) References Cited

U.S. PATENT DOCUMENTS

| | | |
|---|---|---|
| 5,286,941 A | 2/1994 | Bel |
| 5,361,184 A | 11/1994 | El-Sharkawi et al. |
| 5,567,920 A | 10/1996 | Watanabe et al. |
| 5,661,269 A | 8/1997 | Fukuzaki et al. |
| 5,715,529 A | 2/1998 | Kianush et al. |
| 5,898,136 A | 4/1999 | Katsurahira |
| 6,231,520 B1 | 5/2001 | Maezawa |
| 6,283,859 B1 | 9/2001 | Carlson et al. |
| 6,380,923 B1 | 4/2002 | Fukumoto et al. |
| 6,473,708 B1 | 10/2002 | Watkins et al. |
| 7,173,410 B1 | 2/2007 | Pond |
| 7,965,276 B1 | 6/2011 | Martin et al. |
| 8,144,126 B2 | 3/2012 | Wright |
| 8,174,352 B2 | 5/2012 | Parpia et al. |
| 8,346,487 B2 | 1/2013 | Wright et al. |
| 8,384,378 B2 | 2/2013 | Feldkamp et al. |
| 8,421,446 B2 | 4/2013 | Straubinger et al. |
| 8,428,889 B2 | 4/2013 | Wright |
| 8,457,915 B2 | 6/2013 | White et al. |
| 8,674,950 B2 | 3/2014 | Olson |
| 8,970,230 B2 | 3/2015 | Narayanasamy et al. |
| 9,070,856 B1 | 6/2015 | Rose et al. |
| 9,164,605 B1 | 10/2015 | Pirogov et al. |
| 9,707,502 B1 | 7/2017 | Bonifas et al. |
| 10,128,836 B1 | 11/2018 | Buttolo et al. |
| 10,168,855 B2 | 1/2019 | Baughman et al. |
| 10,372,328 B2 | 8/2019 | Zhai |
| 10,571,307 B2 | 2/2020 | Acker |
| 10,599,247 B2 | 3/2020 | Winokur et al. |
| 10,624,691 B2 | 4/2020 | Wiender et al. |
| 10,642,435 B2 | 5/2020 | Maru et al. |
| 10,726,715 B2 | 7/2020 | Iwang et al. |
| 10,795,518 B2 | 10/2020 | Kuan et al. |
| 10,866,677 B2 | 12/2020 | Haraikawa |
| 10,908,200 B2 | 2/2021 | You et al. |
| 10,921,159 B1 | 2/2021 | Das et al. |
| 10,935,620 B2 | 3/2021 | Das et al. |
| 10,942,610 B2 | 3/2021 | Maru et al. |
| 10,948,313 B2 | 3/2021 | Kost et al. |
| 11,079,874 B2 | 8/2021 | Lapointe et al. |
| 11,204,670 B2 | 12/2021 | Maru et al. |
| 11,294,503 B2 | 4/2022 | Westerman |
| 2001/0045941 A1 | 11/2001 | Rosenberg et al. |
| 2003/0038624 A1 | 2/2003 | Hilliard et al. |
| 2005/0192727 A1 | 9/2005 | Shostak et al. |
| 2005/0258826 A1 | 11/2005 | Kano et al. |
| 2005/0283330 A1 | 12/2005 | Laraia et al. |
| 2006/0025897 A1 | 2/2006 | Shostak et al. |
| 2006/0293864 A1 | 12/2006 | Soss |
| 2007/0047634 A1 | 3/2007 | Kang et al. |
| 2007/0080680 A1* | 4/2007 | Schroeder ............... G01L 1/125 324/209 |
| 2007/0198926 A1 | 8/2007 | Joguet et al. |
| 2007/0268265 A1 | 11/2007 | XiaoPing |
| 2007/0296593 A1 | 12/2007 | Hall et al. |
| 2007/0296709 A1 | 12/2007 | GuangHai |
| 2008/0007534 A1 | 1/2008 | Peng et al. |
| 2008/0024456 A1 | 1/2008 | Peng et al. |
| 2008/0088594 A1 | 4/2008 | Liu et al. |
| 2008/0088595 A1 | 4/2008 | Liu et al. |
| 2008/0142352 A1 | 6/2008 | Wright |
| 2008/0143681 A1 | 6/2008 | XiaoPing |
| 2008/0150905 A1 | 6/2008 | Grivna et al. |
| 2008/0158185 A1 | 7/2008 | Westerman |
| 2008/0312857 A1 | 12/2008 | Sequine |
| 2009/0008161 A1 | 1/2009 | Jones et al. |
| 2009/0009195 A1 | 1/2009 | Seguine |
| 2009/0058430 A1 | 3/2009 | Zhu |
| 2009/0140728 A1 | 6/2009 | Rollins et al. |
| 2009/0251216 A1 | 10/2009 | Giotta et al. |
| 2009/0278685 A1 | 11/2009 | Potyrailo et al. |
| 2009/0302868 A1 | 12/2009 | Feucht et al. |
| 2009/0308155 A1 | 12/2009 | Zhang |
| 2010/0019777 A1 | 1/2010 | Balslink |
| 2010/0045360 A1 | 2/2010 | Howard et al. |
| 2010/0114505 A1 | 5/2010 | Wang et al. |
| 2010/0153845 A1 | 6/2010 | Gregorio et al. |
| 2010/0211902 A1 | 8/2010 | Unsworth et al. |
| 2010/0231239 A1 | 9/2010 | Tateishi et al. |
| 2010/0238121 A1 | 9/2010 | Ely |
| 2010/0328249 A1 | 12/2010 | Ningrat et al. |
| 2011/0005090 A1 | 1/2011 | Lee et al. |
| 2011/0214481 A1 | 9/2011 | Kachanov et al. |
| 2011/0216311 A1 | 9/2011 | Kachanov et al. |
| 2011/0267302 A1 | 11/2011 | Fasshauer |
| 2011/0285667 A1 | 11/2011 | Poupyrev et al. |
| 2011/0291821 A1 | 12/2011 | Chung |
| 2011/0301876 A1 | 12/2011 | Yamashita |
| 2012/0050206 A1 | 3/2012 | Welland |
| 2013/0018489 A1 | 1/2013 | Grunthaner et al. |
| 2013/0076374 A1 | 3/2013 | Huang |
| 2013/0106756 A1 | 5/2013 | Kono et al. |
| 2013/0106769 A1 | 5/2013 | Bakken et al. |
| 2013/0269446 A1 | 10/2013 | Fukushima et al. |
| 2014/0002113 A1 | 1/2014 | Schediwy et al. |
| 2014/0028327 A1 | 1/2014 | Potyrailo et al. |
| 2014/0137585 A1 | 5/2014 | Lu et al. |
| 2014/0180042 A1 | 6/2014 | Addison et al. |
| 2014/0225599 A1 | 8/2014 | Hess |
| 2014/0253107 A1 | 9/2014 | Roach et al. |
| 2014/0267065 A1 | 9/2014 | Levesque |
| 2014/0278173 A1 | 9/2014 | Elia et al. |
| 2015/0022174 A1 | 1/2015 | Nikitin |
| 2015/0027139 A1 | 1/2015 | Lin et al. |
| 2015/0077094 A1 | 3/2015 | Baldwin et al. |
| 2015/0084874 A1 | 3/2015 | Cheng et al. |
| 2015/0109243 A1 | 4/2015 | Jun et al. |
| 2015/0293695 A1 | 10/2015 | Schonleben et al. |
| 2015/0329199 A1 | 11/2015 | Golborne et al. |
| 2015/0355043 A1 | 12/2015 | Steeneken et al. |
| 2016/0018940 A1 | 1/2016 | Lo et al. |
| 2016/0048256 A1 | 2/2016 | Day |
| 2016/0117084 A1 | 4/2016 | Ording |
| 2016/0162031 A1 | 6/2016 | Westerman et al. |
| 2016/0169717 A1 | 6/2016 | Zhitomirsky |
| 2016/0179243 A1 | 6/2016 | Schwartz |
| 2016/0231860 A1 | 8/2016 | Elia |
| 2016/0231874 A1 | 8/2016 | Baughman et al. |
| 2016/0241227 A1 | 8/2016 | Hirata |
| 2016/0252403 A1 | 9/2016 | Murakami |
| 2016/0305997 A1 | 10/2016 | Wiesbauer et al. |
| 2016/0357296 A1 | 12/2016 | Picciotto et al. |
| 2017/0023429 A1 | 1/2017 | Straeussnigg et al. |
| 2017/0077735 A1 | 3/2017 | Leabman |
| 2017/0093222 A1 | 3/2017 | Joye et al. |
| 2017/0097437 A1 | 4/2017 | Widmer et al. |
| 2017/0140644 A1 | 5/2017 | Hwang et al. |
| 2017/0147068 A1 | 5/2017 | Yamazaki et al. |
| 2017/0168578 A1 | 6/2017 | Tsukamoto et al. |
| 2017/0169674 A1 | 6/2017 | Macours |
| 2017/0184416 A1 | 6/2017 | Kohlenberg et al. |
| 2017/0185173 A1 | 6/2017 | Ito et al. |
| 2017/0187541 A1 | 6/2017 | Sundaresan et al. |
| 2017/0237293 A1 | 8/2017 | Faraone et al. |
| 2017/0242505 A1 | 8/2017 | Vandermeijden et al. |
| 2017/0282715 A1 | 10/2017 | Fung et al. |
| 2017/0315653 A1 | 11/2017 | Vandermeijden et al. |
| 2017/0322643 A1 | 11/2017 | Eguchi |

(56) References Cited

U.S. PATENT DOCUMENTS

| | | |
|---|---|---|
| 2017/0328740 A1 | 11/2017 | Widmer et al. |
| 2017/0371380 A1 | 12/2017 | Oberhauser et al. |
| 2017/0371381 A1 | 12/2017 | Liu |
| 2017/0371473 A1 | 12/2017 | David et al. |
| 2018/0019722 A1 | 1/2018 | Birkbeck |
| 2018/0020288 A1 | 1/2018 | Risbo et al. |
| 2018/0039331 A1 | 2/2018 | Warren |
| 2018/0055448 A1 | 3/2018 | Karakaya et al. |
| 2018/0059793 A1 | 3/2018 | Hajati |
| 2018/0067601 A1 | 3/2018 | Winokur et al. |
| 2018/0088064 A1 | 3/2018 | Potyrailo et al. |
| 2018/0088702 A1 | 3/2018 | Schutzberg et al. |
| 2018/0097475 A1 | 4/2018 | Djahanshahi et al. |
| 2018/0135409 A1 | 5/2018 | Wilson et al. |
| 2018/0182212 A1 | 6/2018 | Li et al. |
| 2018/0183372 A1 | 6/2018 | Li et al. |
| 2018/0189647 A1 | 7/2018 | Calvo et al. |
| 2018/0195881 A1 | 7/2018 | Acker |
| 2018/0221796 A1 | 8/2018 | Bonifas et al. |
| 2018/0229161 A1 | 8/2018 | Maki et al. |
| 2018/0231485 A1 | 8/2018 | Potyrailo et al. |
| 2018/0260049 A1 | 9/2018 | O'Lionaird et al. |
| 2018/0260050 A1 | 9/2018 | Unseld et al. |
| 2018/0321748 A1 | 11/2018 | Rao et al. |
| 2018/0364731 A1 | 12/2018 | Liu et al. |
| 2019/0052045 A1 | 2/2019 | Metzger et al. |
| 2019/0102031 A1 | 4/2019 | Schutzberg et al. |
| 2019/0137352 A1* | 5/2019 | Edwards .............. G01N 27/023 |
| 2019/0179146 A1 | 6/2019 | De Nardi |
| 2019/0197218 A1 | 6/2019 | Schwartz |
| 2019/0204929 A1 | 7/2019 | Attari et al. |
| 2019/0235629 A1 | 8/2019 | Hu et al. |
| 2019/0286263 A1 | 9/2019 | Bagheri et al. |
| 2019/0302161 A1 | 10/2019 | You et al. |
| 2019/0302193 A1 | 10/2019 | Maru et al. |
| 2019/0302890 A1 | 10/2019 | Marijanovic et al. |
| 2019/0302922 A1 | 10/2019 | Das et al. |
| 2019/0302923 A1 | 10/2019 | Maru et al. |
| 2019/0326906 A1 | 10/2019 | Camacho Cardenas et al. |
| 2019/0339313 A1 | 11/2019 | Vandermeijden |
| 2019/0377468 A1 | 12/2019 | Micci et al. |
| 2020/0006495 A1 | 1/2020 | Siemieniec et al. |
| 2020/0064160 A1 | 2/2020 | Maru et al. |
| 2020/0133455 A1 | 4/2020 | Sepehr et al. |
| 2020/0177290 A1 | 6/2020 | Reimer et al. |
| 2020/0191761 A1 | 6/2020 | Potyrailo et al. |
| 2020/0271477 A1 | 8/2020 | Kost et al. |
| 2020/0271706 A1 | 8/2020 | Wardlaw et al. |
| 2020/0271745 A1 | 8/2020 | Das et al. |
| 2020/0272301 A1 | 8/2020 | Duewer et al. |
| 2020/0319237 A1 | 10/2020 | Maru et al. |
| 2020/0320966 A1 | 10/2020 | Clark et al. |
| 2020/0373923 A1 | 11/2020 | Walsh et al. |
| 2020/0382113 A1 | 12/2020 | Beardsworth et al. |
| 2020/0386804 A1 | 12/2020 | Das et al. |
| 2021/0064137 A1 | 3/2021 | Wopat et al. |
| 2021/0140797 A1 | 5/2021 | Kost et al. |
| 2021/0149538 A1 | 5/2021 | LaPointe et al. |
| 2021/0152174 A1 | 5/2021 | Yancey et al. |
| 2021/0361940 A1 | 11/2021 | Yeh et al. |
| 2021/0396610 A1 | 12/2021 | Li et al. |
| 2021/0404901 A1 | 12/2021 | Kost et al. |
| 2021/0405764 A1 | 12/2021 | Hellman et al. |
| 2022/0075500 A1* | 3/2022 | Chang ..................... G06F 3/044 |
| 2022/0268233 A1 | 8/2022 | Kennedy |
| 2022/0307867 A1 | 9/2022 | Das et al. |
| 2022/0308000 A1 | 9/2022 | Das et al. |

FOREIGN PATENT DOCUMENTS

| | | |
|---|---|---|
| CN | 107076623 A | 8/2017 |
| CN | 209069345 U | 7/2019 |
| CN | 110609610 A | 12/2019 |
| DE | 4004450 A1 | 8/1991 |
| DE | 602004005672 T2 | 12/2007 |
| DE | 102015215330 A1 | 2/2017 |
| DE | 102015215331 A1 | 2/2017 |
| EP | 1697710 B1 | 4/2007 |
| EP | 2682843 A1 | 1/2014 |
| GB | 2394295 A | 4/2004 |
| GB | 2573644 A | 11/2019 |
| GB | 2582065 A | 9/2020 |
| GB | 2582864 A | 10/2020 |
| GB | 2586722 B | 2/2022 |
| JP | 2006246289 A | 9/2006 |
| KR | 20130052059 A | 5/2013 |
| WO | 00/33244 A2 | 6/2000 |
| WO | 20061354832 A2 | 12/2006 |
| WO | 2007068283 A1 | 6/2007 |
| WO | 2016032704 A1 | 3/2016 |
| WO | 2021101722 A1 | 5/2021 |
| WO | 2021101723 A1 | 5/2021 |

OTHER PUBLICATIONS

Combined Search and Examination Report, UKIPO, Application No. GB1904250.6, mailed Sep. 10, 2019.
Combined Search and Examination Report under Sections 17 and 18(3), UKIPO, Application No. GB2001341.3, mailed Jun. 29, 2020.
International Search Report and Written Opinion of the International Searching Authority, International Application No. PCT/US2019/022518, mailed May 24, 2019.
International Search Report and Written Opinion of the International Searching Authority, International Application No. PCT/US2019/022578, mailed May 27, 2019.
International Search Report and Written Opinion of the International Searching Authority, International Application No. PCT/US2019/021838, mailed May 27, 2019.
International Search Report and Written Opinion of the International Searching Authority, International Application No. PCT/US2020/059113, mailed Feb. 23, 2021.
International Search Report and Written Opinion of the International Searching Authority, International Application No. PCT/US2020/059101, mailed Mar. 9, 2021.
First Office Action, China National Intellectual Property Administration, Application No. 201980022689.9, issued Jun. 2, 2021.
First Office Action, China National Intellectual Property Administration, Application No. 201980022693.5, issued Jul. 8, 2021.
Combined Search and Examination Report under Sections 17 and 18(3), UKIPO, Application No. GB2111666.0, mailed Feb. 11, 2022.
Examination Report under Section 18(3), UKIPO, Application No. GB2101804.9, mailed Feb. 25, 2022.
International Search Report and Written Opinion of the International Searching Authority, International Application No. PCT/US2022/012721, mailed Apr. 26, 2022.
Second Office Action, China National Intellectual Property Administration, Application No. 201980022693.5, issued Apr. 13, 2022.
International Search Report and Written Opinion of the International Searching Authority, International Application No. PCT/US2021/035695, mailed Sep. 9, 20201.
Second Office Action, China National Intellectual Property Administration, Application No. 201980022689.9, mailed Oct. 27, 2021.
Second Office Action, China National Intellectual Property Administration, Application No. 201980022693.5, mailed Dec. 14, 2021.
International Search Report and Written Opinion of the International Searching Authority, International Application No. PCT/US2022/018886, mailed Jun. 10, 2022.
Combined Search and Examination Report under Sections 17 and 18(3), UKIPO, Application No. GB2201194.4, mailed Jul. 1, 2022.
International Search Report and Written Opinion of the International Searching Authority, International Application No. PCT/US2022/018475, mailed Aug. 2, 2022.
First Office Action, China National Intellectual Property Administration, Application No. 202010105829.3, issued Apr. 12, 2022, received by counsel Jul. 28, 2022.

(56) References Cited

OTHER PUBLICATIONS

Examination Report under Section 18(3), UKIPO, Application No. GB2015439.9, mailed May 10, 2022.
Notice of Preliminary Rejection, Korean Intellectual Property Office, Application No. 10-2020-7029597, mailed Jul. 29, 2022.
First Office Action, China Intellectual Property Administration, Application No. 202180043659.3, issued Sep. 8, 2023.
Combined Search and Examination Report, United Kingdom Intellectual Property Office, Application No. GB2313599.9, mailed Oct. 9, 2023.
Combined Search and Examination Report under Sections 17 and 18(3), United Kingdom Intellectual Property Office, Application No. GB2215005.6, mailed Apr. 11, 2023.
Gao, Shuo, et al., Piezoelectric vs. Capactivie Based Force Sensing in Capacitive Touch Panels, IEEE Access, vol. 4, Jul. 14, 2016.
Second Office Action, China National Intellectual Property Administration, Application No. 201980054799.3, issued May 24, 2023.

\* cited by examiner

FAR FIELD INTERFERENCE CANCELLATION FOR RESISTIVE-INDUCTIVE-CAPACITIVE SENSORS

RELATED APPLICATION

The present disclosure claims priority to U.S. Provisional Patent Application Ser. No. 62/649,870, filed Mar. 29, 2018, U.S. Provisional Patent Application Ser. No. 62/739,970, filed Oct. 2, 2018, U.S. Provisional Patent Application Ser. No. 62/649,857, filed Mar. 29, 2018, and U.S. Provisional Patent Application Ser. No. 62/721,134, filed Aug. 22, 2018, all of which are incorporated by reference herein in their entireties.

FIELD OF DISCLOSURE

The present disclosure relates in general to electronic devices with user interfaces (e.g., mobile devices, game controllers, instrument panels, etc.), and more particularly, resonant phase sensing of resistive-inductive-capacitive sensors for use in a system for mechanical button replacement in a mobile device, and/or other suitable applications.

BACKGROUND

Many traditional mobile devices (e.g., mobile phones, personal digital assistants, video game controllers, etc.) include mechanical buttons to allow for interaction between a user of a mobile device and the mobile device itself. However, such mechanical buttons are susceptible to aging, wear, and tear that may reduce the useful life of a mobile device and/or may require significant repair if malfunction occurs. Also, the presence of mechanical buttons may render it difficult to manufacture mobile devices to be waterproof. Accordingly, mobile device manufacturers are increasingly looking to equip mobile devices with virtual buttons that act as a human-machine interface allowing for interaction between a user of a mobile device and the mobile device itself. Similarly, mobile device manufacturers are increasingly looking to equip mobile devices with other virtual interface areas (e.g., a virtual slider, interface areas of a body of the mobile device other than a touch screen, etc.). Ideally, for best user experience, such virtual interface areas should look and feel to a user as if a mechanical button or other mechanical interface were present instead of a virtual button or virtual interface area.

Presently, linear resonant actuators (LRAs) and other vibrational actuators (e.g., rotational actuators, vibrating motors, etc.) are increasingly being used in mobile devices to generate vibrational feedback in response to user interaction with human-machine interfaces of such devices. Typically, a sensor (traditionally a force or pressure sensor) detects user interaction with the device (e.g., a finger press on a virtual button of the device) and in response thereto, the linear resonant actuator may vibrate to provide feedback to the user. For example, a linear resonant actuator may vibrate in response to user interaction with the human-machine interface to mimic to the user the feel of a mechanical button click.

However, there is a need in the industry for sensors to detect user interaction with a human-machine interface, wherein such sensors provide acceptable levels of sensor sensitivity, power consumption, and size.

One way to detect user interaction with a human-machine interface is that of inductive sensing, which may be implemented using a metal plate and an inductor located at a certain distance from one another. When current flows through the inductor, the magnetic field induced by the current further induces an eddy current inside the metal plate. When force is applied to the metal plate, changing the distance between the metal plate and the inductor, the coupling between the inductor and metal plate changes, thus modifying an effective impedance seen at the terminals of the inductor. By sensing such change in effective impedance, the applied force or other interaction with the metal plate may be sensed.

However, such an inductive-based sensor may be sensitive to an external electromagnetic field. This external electromagnetic field may induce undesirable current in the sense inductor, and such electromagnetic field may interfere with (known as far field interference) and impact measurement of the sensing circuit.

SUMMARY

In accordance with the teachings of the present disclosure, the disadvantages and problems associated with sensing of human-machine interface interactions in a mobile device may be reduced or eliminated.

In accordance with embodiments of the present disclosure, an apparatus for use in inductive-based sensing may include an inductor and one or more mechanical members. The inductor may include a plurality of inductor coils comprising a plurality of first inductor coils and a plurality of second inductor coils, each inductor coil comprising a spiraling wire of electrically-conductive material wherein the wire of electrically-conductive material is arranged substantially in a plane, wherein the plurality of first inductor coils and the plurality of second inductor coils are electrically coupled to one another and arranged with respect to one another such that within the plane, electrical current flowing through the inductor flows clockwise in the first inductor coils, within the plane, electrical current flowing through the inductor flows counterclockwise in the second inductor coils, each first inductor coil is adjacent to at least one second inductor coil, and each second inductor coil is adjacent to at least one first inductor coil. The one or more mechanical members may be arranged proximate to a respective one of the plurality of inductor coils such that displacement of the one or more mechanical members causes a change in an effective impedance of the inductor.

In accordance with these and other embodiments of the present disclosure, a method may include forming an inductor comprising a plurality of inductor coils comprising a plurality of first inductor coils and a plurality of second inductor coils, each inductor coil comprising a spiraling wire of electrically-conductive material wherein the wire of electrically-conductive material is arranged substantially in a plane, wherein the plurality of first inductor coils and the plurality of second inductor coils are electrically coupled to one another and arranged with respect to one another such that within the plane, electrical current flowing through the inductor flows clockwise in the first inductor coils, within the plane, electrical current flowing through the inductor flows counterclockwise in the second inductor coils, each first inductor coil is adjacent to at least one second inductor coil, and each second inductor coil is adjacent to at least one first inductor coil. The method may also include placing one or more mechanical members proximate to the inductor, such that the one or more mechanical members are arranged proximate to the plurality of inductor coils such that displacement of the one or more mechanical members causes a change in an effective impedance of the inductor.

In accordance with these and other embodiments of the present disclosure, a method may include sensing a change in effective impedance of an inductor, the inductor comprising a plurality of inductor coils comprising a plurality of first inductor coils and a plurality of second inductor coils, each inductor coil comprising a spiraling wire of electrically-conductive material wherein the wire of electrically-conductive material is arranged substantially in a plane, wherein the plurality of first inductor coils and the plurality of second inductor coils are electrically coupled to one another and arranged with respect to one another such that within the plane, electrical current flowing through the inductor flows clockwise in the first inductor coils, within the plane, electrical current flowing through the inductor flows counterclockwise in the second inductor coils, each first inductor coil is adjacent to at least one second inductor coil, and each second inductor coil is adjacent to at least one first inductor coil. One or more mechanical members may be proximate to the inductor, such that each of the plurality of mechanical members are arranged proximate to the plurality of inductor coils such that displacement of the one or more mechanical members causes a change in an effective impedance of the inductor.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
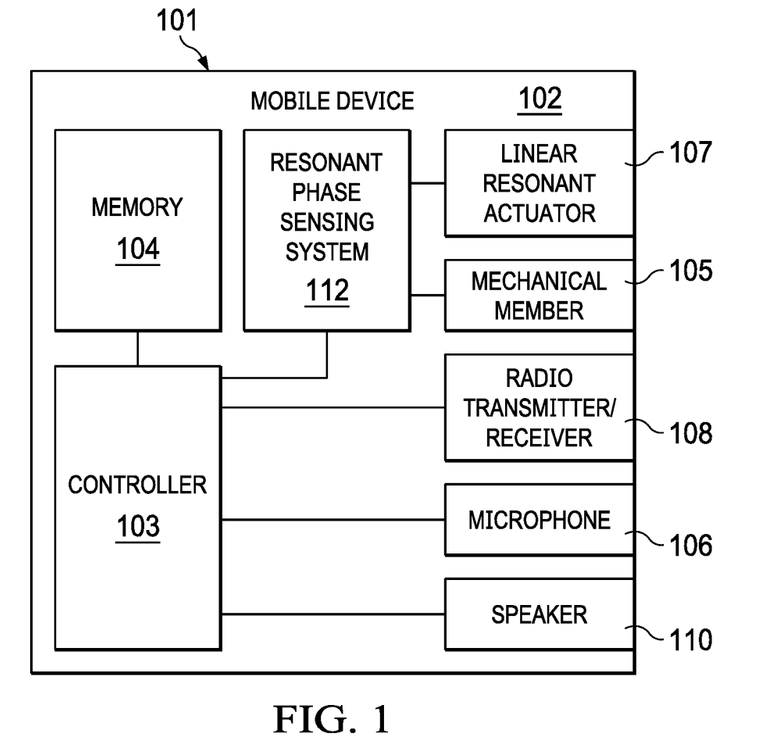
FIG. 1 illustrates a block diagram of selected components of an example mobile device, in accordance with embodiments of the present disclosure.

FIG. 1 illustrates a block diagram of selected components of an example mobile device 102, in accordance with embodiments of the present disclosure. As shown in FIG. 1, mobile device 102 may comprise an enclosure 101, a controller 103, a memory 104, one or more mechanical members 105, a microphone 106, a linear resonant actuator 107, a radio transmitter/receiver 108, a speaker 110, and a resonant phase sensing system 112.

Enclosure 101 may comprise any suitable housing, casing, or other enclosure for housing the various components of mobile device 102. Enclosure 101 may be constructed from plastic, metal, and/or any other suitable materials. In addition, enclosure 101 may be adapted (e.g., sized and shaped) such that mobile device 102 is readily transported on a person of a user of mobile device 102. Accordingly, mobile device 102 may include but is not limited to a smart phone, a tablet computing device, a handheld computing device, a personal digital assistant, a notebook computer, a video game controller, or any other device that may be readily transported on a person of a user of mobile device 102.

Controller 103 may be housed within enclosure 101 and may include any system, device, or apparatus configured to interpret and/or execute program instructions and/or process data, and may include, without limitation a microprocessor, microcontroller, digital signal processor (DSP), application specific integrated circuit (ASIC), or any other digital or analog circuitry configured to interpret and/or execute program instructions and/or process data. In some embodiments, controller 103 may interpret and/or execute program instructions and/or process data stored in memory 104 and/or other computer-readable media accessible to controller 103.

Memory 104 may be housed within enclosure 101, may be communicatively coupled to controller 103, and may include any system, device, or apparatus configured to retain program instructions and/or data for a period of time (e.g., computer-readable media). Memory 104 may include random access memory (RAM), electrically erasable programmable read-only memory (EEPROM), a Personal Computer Memory Card International Association (PCMCIA) card, flash memory, magnetic storage, opto-magnetic storage, or any suitable selection and/or array of volatile or non-volatile memory that retains data after power to mobile device 102 is turned off.

Microphone 106 may be housed at least partially within enclosure 101, may be communicatively coupled to controller 103, and may comprise any system, device, or apparatus configured to convert sound incident at microphone 106 to an electrical signal that may be processed by controller 103, wherein such sound is converted to an electrical signal using a diaphragm or membrane having an electrical capacitance that varies based on sonic vibrations received at the diaphragm or membrane. Microphone 106 may include an electrostatic microphone, a condenser microphone, an electret microphone, a microelectromechanical systems (MEMs) microphone, or any other suitable capacitive microphone.

Radio transmitter/receiver 108 may be housed within enclosure 101, may be communicatively coupled to controller 103, and may include any system, device, or apparatus configured to, with the aid of an antenna, generate and transmit radio-frequency signals as well as receive radio-frequency signals and convert the information carried by such received signals into a form usable by controller 103. Radio transmitter/receiver 108 may be configured to transmit and/or receive various types of radio-frequency signals, including without limitation, cellular communications (e.g., 2G, 3G, 4G, LTE, etc.), short-range wireless communications (e.g., BLUETOOTH), commercial radio signals, television signals, satellite radio signals (e.g., GPS), Wireless Fidelity, etc.

A speaker 110 may be housed at least partially within enclosure 101 or may be external to enclosure 101, may be communicatively coupled to controller 103, and may comprise any system, device, or apparatus configured to produce sound in response to electrical audio signal input. In some embodiments, a speaker may comprise a dynamic loudspeaker, which employs a lightweight diaphragm mechanically coupled to a rigid frame via a flexible suspension that constrains a voice coil to move axially through a magnetic gap. When an electrical signal is applied to the voice coil, a magnetic field is created by the electric current in the voice coil, making it a variable electromagnet. The voice coil and the driver's magnetic system interact, generating a mechanical force that causes the voice coil (and thus, the attached cone) to move back and forth, thereby reproducing sound under the control of the applied electrical signal coming from the amplifier.

A mechanical member 105 may be housed within or upon enclosure 101, and may include any suitable system, device, or apparatus configured such that all or a portion of mechanical member 105 displaces in position responsive to a force, a pressure, or a touch applied upon or proximately to mechanical member 105. In some embodiments, mechanical member 105 may be designed to appear as a mechanical button on the exterior of enclosure 101.

Linear resonant actuator 107 may be housed within enclosure 101, and may include any suitable system, device, or apparatus for producing an oscillating mechanical force across a single axis. For example, in some embodiments, linear resonant actuator 107 may rely on an alternating current voltage to drive a voice coil pressed against a moving mass connected to a spring. When the voice coil is driven at the resonant frequency of the spring, linear resonant actuator 107 may vibrate with a perceptible force. Thus, linear resonant actuator 107 may be useful in haptic applications within a specific frequency range. While, for the purposes of clarity and exposition, this disclosure is described in relation to the use of linear resonant actuator 107, it is understood that any other type or types of vibrational actuators (e.g., eccentric rotating mass actuators) may be used in lieu of or in addition to linear resonant actuator 107. In addition, it is also understood that actuators arranged to produce an oscillating mechanical force across multiple axes may be used in lieu of or in addition to linear resonant actuator 107. As described elsewhere in this disclosure, a linear resonant actuator 107, based on a signal received from resonant phase sensing system 112, may render haptic feedback to a user of mobile device 102 for at least one of mechanical button replacement and capacitive sensor feedback.

Together, mechanical member(s) 105 and linear resonant actuator 107 may form a human-interface device, such as a virtual interface (e.g., a virtual button), which, to a user of mobile device 102, has a look and feel of a mechanical button or other mechanical interface of mobile device 102.

Resonant phase sensing system 112 may be housed within enclosure 101, may be communicatively coupled to mechanical member(s) 105 and linear resonant actuator 107, and may include any system, device, or apparatus configured to detect a displacement of mechanical member(s) 105 indicative of a physical interaction (e.g., by a user of mobile device 102) with the human-machine interface of mobile device 102 (e.g., a force applied by a human finger to a virtual interface of mobile device 102). As described in greater detail below, resonant phase sensing system 112 may detect displacement of mechanical member(s) 105 by performing resonant phase sensing of a resistive-inductive-capacitive sensor for which an impedance (e.g., inductance, capacitance, and/or resistance) of the resistive-inductive-capacitive sensor changes in response to displacement of mechanical member(s) 105. Thus, mechanical member(s) 105 may comprise any suitable system, device, or apparatus which all or a portion thereof may displace, and such displacement may cause a change in an impedance of a resistive-inductive-capacitive sensor integral to resonant phase sense system 112. Resonant phase sensing system 112 may also generate an electronic signal for driving linear resonant actuator 107 in response to a physical interaction associated with a human-machine interface associated with mechanical member(s) 105. Detail of an example resonant phase sensing system 112 in accordance with embodiments of the present disclosure is depicted in greater detail below.

Although specific example components are depicted above in FIG. 1 as being integral to mobile device 102 (e.g., controller 103, memory 104, mechanical member(s) 105, microphone 106, radio transmitter/receiver 108, speakers(s) 110, linear resonant actuator 107, etc.), a mobile device 102 in accordance with this disclosure may comprise one or more components not specifically enumerated above. For example, although FIG. 1 depicts certain user interface components, mobile device 102 may include one or more other user interface components in addition to those depicted in FIG. 1, including but not limited to a keypad, a touch screen, and a display, thus allowing a user to interact with and/or otherwise manipulate mobile device 102 and its associated components. In addition, although FIG. 1 depicts only a single virtual button comprising mechanical member 105 and linear resonant actuator 107 for purposes of clarity and exposition, in some embodiments a mobile device 102 may have multiple virtual interfaces each comprising a respective mechanical member 105 and/or linear resonant actuator 107.

Although, as stated above, resonant phase sensing system 112 may detect displacement of mechanical member(s) 105 by performing resonant phase sensing of a resistive-inductive-capacitive sensor for which an impedance (e.g., inductance, capacitance, and/or resistance) of the resistive-inductive-capacitive sensor changes in response to displacement of mechanical member(s) 105, in some embodiments resonant phase sensing system 112 may primarily detect displacement of mechanical member(s) 105 by using resonant phase sensing to determine a change in an inductance of a resistive-inductive-capacitive sensor. For example, FIGS. 2 and 3 illustrate selected components of an example inductive sensing application that may be implemented by resonant phase sensing system 112, in accordance with embodiments of the present disclosure.

Figure 2:
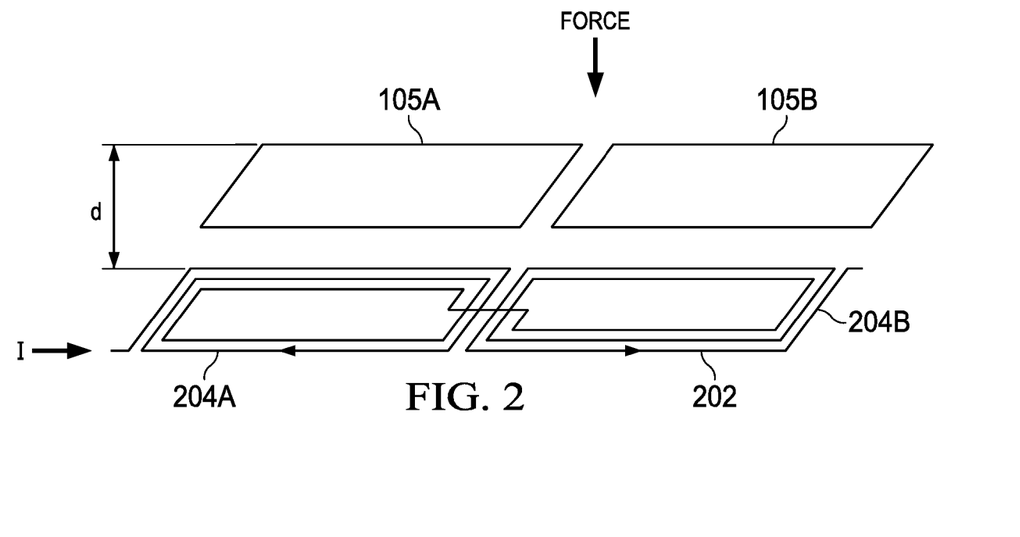
FIG. 2 illustrates a plurality of mechanical members separated by a distance from an inductive coil, in accordance with embodiments of the present disclosure.

FIG. 2 illustrates two mechanical members 105A and 105B each embodied as a metal plate separated by a distance d from an inductor 202, in accordance with embodiments of the present disclosure. FIG. 3 illustrates selected components of an inductive sensing system 300 that may be implemented by resonant phase sensing system 112, in accordance with embodiments of the present disclosure. As shown in FIG. 3, inductive sensing system 300 may include mechanical members 105, each modeled as a variable electrical resistance 304 and a variable electrical inductance 306, and may include inductor 202 in physical proximity to mechanical members 105 such that inductor 202 has mutual inductances with mechanical member 105 defined by a variable coupling coefficients $k_1$ and $k_2$. As shown in FIG. 3, inductor 202 may be modeled as a variable electrical inductance 308 and a variable electrical resistance 310.

In operation, as a current I flows through inductor 202, such current may induce a magnetic field which in turn may induce an eddy current inside mechanical members 105. When a force is applied to and/or removed from mechanical members 105, which alters distance d between a mechanical member 105 and inductor 202, the coupling coefficients $k_1$ and $k_2$, variable electrical resistances 304, and/or variable electrical inductances 306 may also change in response to the change in distance. These changes in the various electrical parameters may, in turn, modify an effective impedance $Z_L$ of inductor 202.

Figure 3:
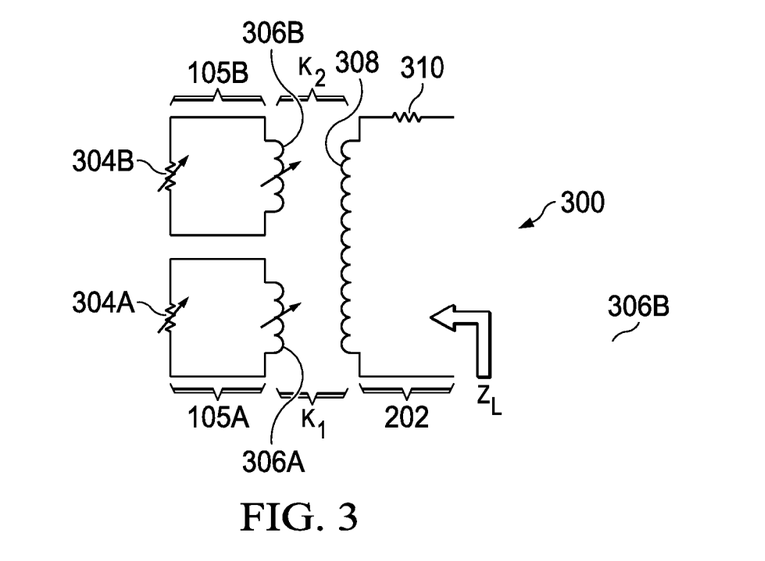
FIG. 3 illustrates selected components of an inductive sensing system that may be implemented by a resonant phase sensing system, in accordance with embodiments of the present disclosure.

As shown in FIGS. 2 and 3, inductor 202 may comprise two inductor coils 204A and 204B. As shown in FIG. 2, rather than being formed from a substantially cylindrical coil of wire, each of inductor coils 204A and 204B may be formed from a spiraling wire of conductive material such that the wire forming the spiraling wire is all substantially co-planar. Inductor coils 204A and 204B may be formed into a "Figure-8" configuration in which each inductor coil 204A and 204B may have windings and inductor coils 204A and 204B may be formed and coupled to each other such that when a current I flows in inductor 202, such current I may flow in a clockwise fashion from the perspective of the direction of "FORCE" shown in FIG. 2 in one of the inductor coils (e.g., inductor coil 204A as depicted in FIG. 2) while such current I flows in a counterclockwise fashion from the perspective of the direction of "FORCE" shown in FIG. 2 in the other inductor coil (e.g., inductor coil 204B as depicted in FIG. 2). In other words, the arrangement of the spiraling wire may be such that a direction of a magnetic field through the center of inductor coil 204A induced by current I through inductor 202 is substantially equal in magnitude but opposite in direction of a magnetic field through the center of inductor coil 204B induced by current I through inductor 202. With such arrangement, any inductor current caused by external electromagnetic interference (e.g., far field interference) may cause such far-field induced current to flow in opposite directions in each of inductor coils 204A and 204B, thus cancelling out the effects of far field interference within inductor 202.

Although FIG. 2 depicts two separate mechanical members 105A and 105B, in some embodiments, a single mechanical member 105 may be utilized wherein the single mechanical member 105 may have a coupling coefficient $k_1$ with inductor coil 204A and a coupling coefficient $k_2$ with inductor coil 204B.

Figure 4:
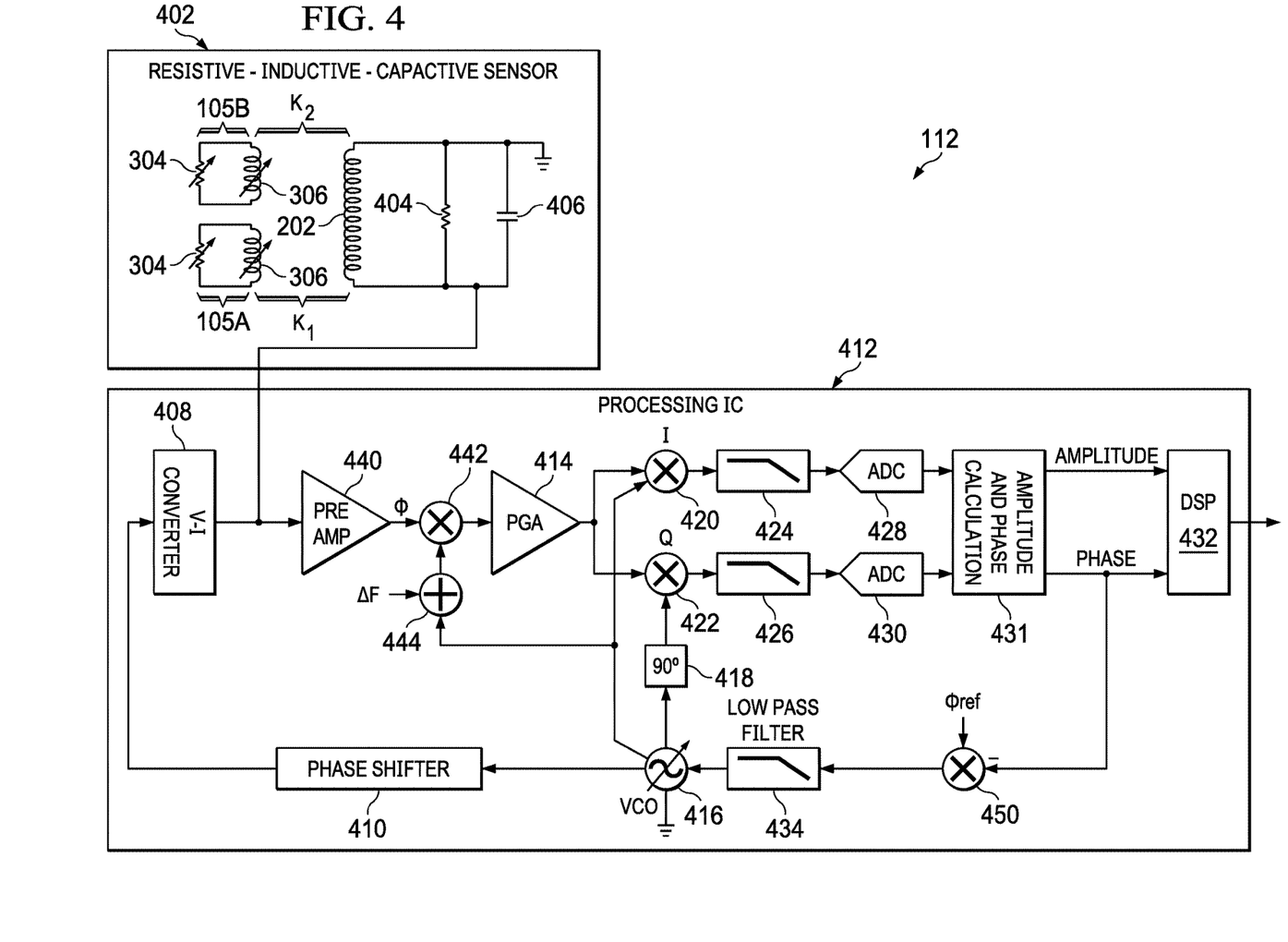
FIG. 4 illustrates a diagram of selected components of an example resonant phase sensing system, in accordance with embodiments of the present disclosure.

FIG. 4 illustrates a diagram of selected components of an example resonant phase sensing system 112, in accordance with embodiments of the present disclosure. In some embodiments, resonant phase sensing system 112 may be used to implement resonant phase sensing system 112 of FIG. 1. As shown FIG. 4, resonant phase sensing system 112 may include a resistive-inductive-capacitive sensor 402 and a processing integrated circuit (IC) 412.

As shown in FIG. 4, resistive-inductive-capacitive sensor 402 may include mechanical members 105A and 105B (which may be referred to herein individually as a mechanical member 105 and collectively as mechanical members 105), inductor 202, a resistor 404, and capacitor 406, wherein mechanical members 105 and inductor 202 have a variable coupling coefficient $k_1$ and $k_2$. Although shown in FIG. 4 to be arranged in parallel with one another, it is understood that inductor 202, resistor 404, and capacitor 406 may be arranged in any other suitable manner that allows resistive-inductive-capacitive sensor 402 to act as a resonant tank. For example, in some embodiments, inductor 202, resistor 404, and capacitor 406 may be arranged in series with one another. In some embodiments, resistor 404 may not be implemented with a stand-alone resistor, but may instead be implemented by a parasitic resistance of inductor 202, a parasitic resistance of capacitor 406, and/or any other suitable parasitic resistance.

Processing IC 412 may be communicatively coupled to resistive-inductive-capacitive sensor 402 and may comprise any suitable system, device, or apparatus configured to implement a measurement circuit to measure phase information associated with resistive-inductive-capacitive sensor 402 and based on the phase information, determine a displacement of mechanical member(s) 105 relative to resistive-inductive-capacitive sensor 402. Thus, processing IC 412 may be configured to determine an occurrence of a physical interaction (e.g., press or release of a virtual button) associated with a human-machine interface associated with mechanical member(s) 105 based on the phase information.

As shown in FIG. 4, processing IC 412 may include a phase shifter 410, a voltage-to-current converter 408, a preamplifier 440, an intermediate frequency mixer 442, a combiner 444, a programmable gain amplifier (PGA) 414, a voltage-controlled oscillator (VCO) 416, a variable phase shifter 418, an amplitude and phase calculation block 431, a DSP 432, a low-pass filter 434, and a combiner 450. Processing IC 412 may also include a coherent incident/quadrature detector implemented with an incident channel comprising a mixer 420, a low-pass filter 424, and an analog-to-digital converter (ADC) 428, and a quadrature channel comprising a mixer 422, a low-pass filter 426, and an ADC 430 such that processing IC 412 is configured to measure the phase information using the coherent incident/quadrature detector.

Phase shifter 410 may include any system, device, or apparatus configured to detect an oscillation signal generated by processing IC 412 (as explained in greater detail below) and phase shift such oscillation signal (e.g., by 45 degrees) such that a normal operating frequency of resonant phase sensing system 112, an incident component of a sensor signal ϕ generated by pre-amplifier 440, is approximately equal to a quadrature component of sensor signal ϕ, so as to provide common mode noise rejection by a phase detector implemented by processing IC 412, as described in greater detail below.

Voltage-to-current converter 408 may receive the phase shifted oscillation signal from phase shifter 410, which may be a voltage signal, convert the voltage signal to a corresponding current signal, and drive the current signal on resistive-inductive-capacitive sensor 402 at a driving frequency with the phase-shifted oscillation signal in order to generate sensor signal ϕ which may be processed by processing IC 412, as described in greater detail below. In some embodiments, a driving frequency of the phase-shifted oscillation signal may be selected based on a resonant frequency of resistive-inductive-capacitive sensor 402 (e.g., may be approximately equal to the resonant frequency of resistive-inductive-capacitive sensor 402).

Preamplifier 440 may receive sensor signal φ and condition sensor signal φ for frequency mixing, with mixer 442, to an intermediate frequency Δf combined by combiner 444 with an oscillation frequency generated by VCO 416, as described in greater detail below, wherein intermediate frequency Δf is significantly less than the oscillation frequency. In some embodiments, preamplifier 440, mixer 442, and combiner 444 may not be present, in which case PGA 414 may receive sensor signal φ directly from resistive-inductive-capacitive sensor 402. However, when present, preamplifier 440, mixer 442, and combiner 444 may allow for mixing sensor signal φ down to a lower intermediate frequency Δf which may allow for lower-bandwidth and more efficient ADCs (e.g., ADCs 428 and 430 of FIG. 4) and/or which may allow for minimization of phase and/or gain mismatches in the incident and quadrature paths of the phase detector of processing IC 412.

In operation, PGA 414 may further amplify sensor signal φ to condition sensor signal φ for processing by the coherent incident/quadrature detector. VCO 416 may generate an oscillation signal to be used as a basis for the signal driven by voltage-to-current converter 408, as well as the oscillation signals used by mixers 420 and 422 to extract incident and quadrature components of amplified sensor signal φ. As shown in FIG. 4, mixer 420 of the incident channel may use an unshifted version of the oscillation signal generated by VCO 416, while mixer 422 of the quadrature channel may use a 90-degree shifted version of the oscillation signal phase shifted by phase shifter 418. As mentioned above, the oscillation frequency of the oscillation signal generated by VCO 416 may be selected based on a resonant frequency of resistive-inductive-capacitive sensor 402 (e.g., may be approximately equal to the resonant frequency of resistive-inductive-capacitive sensor 402).

In the incident channel, mixer 420 may extract the incident component of amplified sensor signal φ, low-pass filter 424 may filter out the oscillation signal mixed with the amplified sensor signal φ to generate a direct current (DC) incident component, and ADC 428 may convert such DC incident component into an equivalent incident component digital signal for processing by amplitude and phase calculation block 431. Similarly, in the quadrature channel, mixer 422 may extract the quadrature component of amplified sensor signal φ, low-pass filter 426 may filter out the phase-shifted oscillation signal mixed with the amplified sensor signal φ to generate a direct current (DC) quadrature component, and ADC 430 may convert such DC quadrature component into an equivalent quadrature component digital signal for processing by amplitude and phase calculation block 431.

Amplitude and phase calculation block 431 may include any system, device, or apparatus configured to receive phase information comprising the incident component digital signal and the quadrature component digital signal and based thereon, extract amplitude and phase information.

DSP 432 may include any system, device, or apparatus configured to interpret and/or execute program instructions and/or process data. In particular, DSP 432 may receive the phase information and the amplitude information generated by amplitude and phase calculation block 431 and based thereon, determine a displacement of mechanical member 105 relative to resistive-inductive-capacitive sensor 402, which may be indicative of an occurrence of a physical interaction (e.g., press or release of a virtual button or other interaction with a virtual interface) associated with a human-machine interface associated with mechanical member 105 based on the phase information. DSP 432 may also generate an output signal indicative of the displacement. In some embodiments, such output signal may comprise a control signal for controlling mechanical vibration of linear resonant actuator 107 in response to the displacement.

The phase information generated by amplitude and phase calculation block 431 may be subtracted from a reference phase $\phi_{ref}$ by combiner 450 in order to generate an error signal that may be received by low-pass filter 434. Low-pass filter 434 may low-pass filter the error signal, and such filtered error signal may be applied to VCO 416 to modify the frequency of the oscillation signal generated by VCO 416, in order to drive sensor signal φ towards reference phase $\phi_{ref}$. As a result, sensor signal φ may comprise a transient decaying signal in response to a "press" of a virtual button (or other interaction with a virtual interface) associated with resonant phase sensing system 112 as well as another transient decaying signal in response to a subsequent "release" of the virtual button (or other interaction with a virtual interface). Accordingly, low-pass filter 434 in connection with VCO 416 may implement a feedback control loop that may track changes in operating parameters of resonant phase sensing system 112 by modifying the driving frequency of VCO 416.

Although the foregoing contemplates use of embodiments of a resonant phase sensing system 112 represented by FIG. 4, other embodiments beyond those represented by FIG. 4 may be utilized. For example, the systems and methods herein may be utilized in connection with one or more of the resonant phase sensing systems described in U.S. patent application Ser. No. 16/267,079, entitled "Resonant Phase Sensing of Resistive-Inductive-Capacitive Sensors," filed Feb. 4, 2019, and incorporated by reference herein in its entirety.

Although the foregoing contemplates use of closed-loop feedback for sensing of displacement, the various embodiments represented by FIG. 4 may be modified to implement an open-loop system for sensing of displacement. In such an open-loop system, a processing IC may include no feedback path from amplitude and phase calculation block 431 to VCO 416 thus may also lack a feedback low-pass filter 434. Thus, a phase measurement may still be made by comparing a change in phase to a reference phase value, but the oscillation frequency driven by VCO 416 may not be modified.

Although the foregoing contemplates use of a coherent incident/quadrature detector as a phase detector for determining phase information associated with resistive-inductive-capacitive sensor 402, a resonant phase sensing system 112 may perform phase detection and/or otherwise determine phase information associated with resistive-inductive-capacitive sensor 402 in any suitable manner, including, without limitation, using only one of the incident path or quadrature path to determine phase information.

In some embodiments, an incident/quadrature detector as disclosed herein may include one or more frequency translation stages that translate the sensor signal into direct-current signal directly or into an intermediate frequency signal and then into a direct-current signal. Any of such frequency translation stages may be implemented either digitally after an analog-to-digital converter stage or in analog before an analog-to-digital converter stage.

In addition, although the foregoing contemplates measuring changes in resistance and inductance in resistive-inductive-capacitive sensor 402 caused by displacement of mechanical member(s) 105, other embodiments may operate based on a principle that any change in impedance based on displacement of mechanical member(s) 105 may be used to sense displacement. For example, in some embodiments, displacement of mechanical member 105 may cause a change in a capacitance of resistive-inductive-capacitive sensor 402, such as if mechanical member(s) 105 included a metal plate implementing one of the capacitive plates of capacitor 406.

Although DSP 432 may be capable of processing phase information to make a binary determination of whether physical interaction associated with a human-machine interface associated with mechanical member(s) 105 has occurred and/or ceased to occur, in some embodiments, DSP 432 may quantify a duration of a displacement of mechanical member(s) 105 to more than one detection threshold, for example to detect different types of physical interactions (e.g., a short press of a virtual button versus a long press of the virtual button). In these and other embodiments, DSP 432 may quantify a magnitude of the displacement to more than one detection threshold, for example to detect different types of physical interactions (e.g., a light press of a virtual button versus a quick and hard press of the virtual button).

Figure 5:
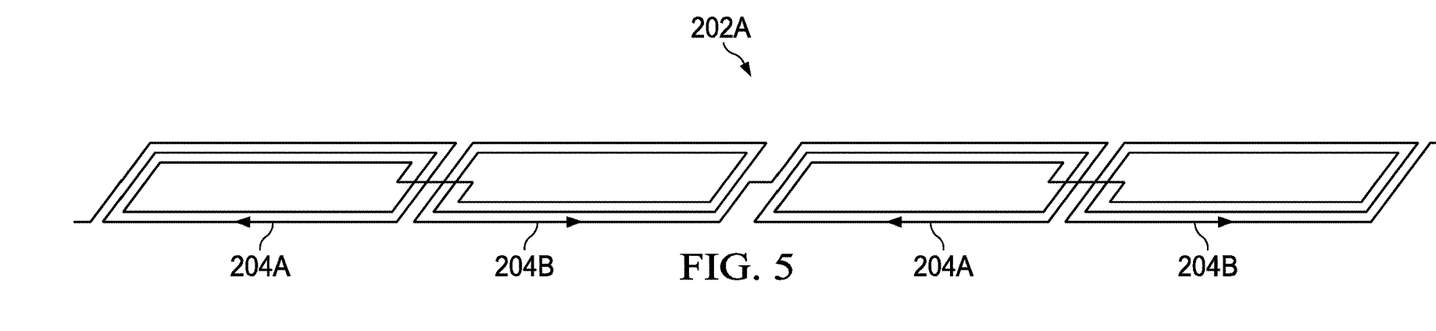
FIG. 5 illustrates a diagram of selected components of an example inductor having inductor coils arranged in a linear array, in accordance with embodiments of the present disclosure.

Although the foregoing contemplates use of an inductor 202 in an inductive-based sensor having two inductor coils 204A and 204B as shown in FIG. 2, in some embodiments, an inductor 202 may include multiple instances of inductor coils 204A and 204B arranged to reduce far field interference. For example, FIG. 5 illustrates a diagram of selected components of an example inductor 202A having multiple inductor coils 204A and multiple inductor coils 204B arranged in a linear array, in accordance with embodiments of the present disclosure. As shown, inductor coils 204A and inductor coils 204B may be electrically coupled to one another in an alternating fashion in a linear direction such that a single imaginary line crosses substantially through the center of each of inductor coils 204A and inductor coils 204B. Although not depicted in FIG. 5 for the purposes of clarity and exposition, each of inductor coils 204A and inductor coils 204B may be proximate to a respective mechanical member 105. In an arrangement such as that shown in FIG. 5, immunity to far field interference may increase by increasing the number of inductor coils 204A and inductor coils 204B integral to inductor 202A.

Figure 6:
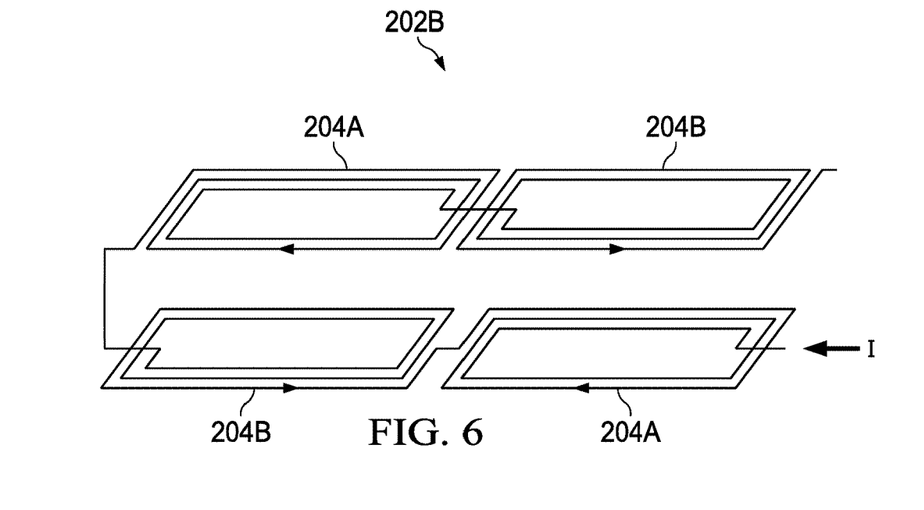
FIG. 6 illustrates a diagram of selected components of an example inductor having inductor coils arranged in a matrix array, in accordance with embodiments of the present disclosure.

As another example, FIG. 6 illustrates a diagram of selected components of an example inductor 202B having inductor coils arranged in a matrix array, in accordance with embodiments of the present disclosure. As shown, inductor coils 204A and inductor coils 204B may be electrically coupled to one another in a two-dimensional alternating checkerboard fashion such that no inductor coil 204A is adjacent to another inductor coil 204A and no inductor coil 204B is adjacent to another inductor coil 204B. Although not depicted in FIG. 6 for the purposes of clarity and exposition, each of inductor coils 204A and inductor coils 204B may be proximate to a respective mechanical member 105. In an arrangement such as that shown in FIG. 6, immunity to far field interference may increase by increasing the number of inductor coils 204A and inductor coils 204B integral to inductor 202B.

Figure 7:
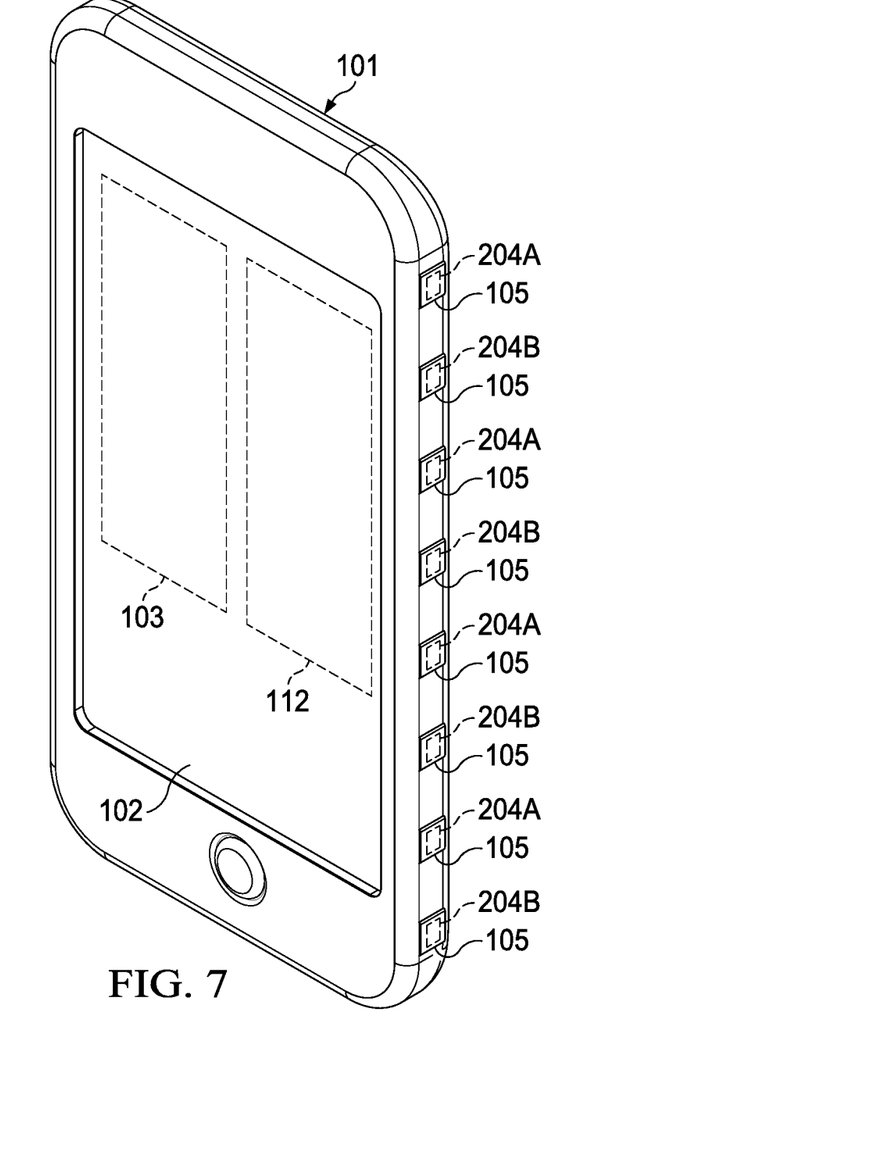
FIG. 7 illustrates a schematic diagram of an example mobile device, in accordance with embodiments of the present disclosure.

In some embodiments, a device may include multiple instances of the arrays depicted in FIGS. 6 and 7. For example, in some embodiments, a device may include multiple linear array inductors 202A placed in proximity to one another, either side-by-side or end-to-end, each linear array inductor 202A including respective mechanical member(s) 105. As another example, a device may include multiple matrix array inductors 202B placed in proximity to one another, including respective mechanical member(s) 105.

FIG. 7 illustrates a schematic diagram of selected components of example mobile device 102, in accordance with embodiments of the present disclosure. As shown in FIG. 7, mobile device 102 may include a plurality of mechanical members 105 formed on a side of enclosure 101. Placed within enclosure 101 and adjacent to each mechanical member 105 may be a respective inductor coil 204A/204B. In some embodiments, each pair of inductor coils 204A/204B may form a corresponding inductor 202 as shown in FIG. 2. In other embodiments, multiple pairs of inductor coils 204A/204B may form a corresponding linear array inductor 202A as shown in FIG. 5. Also, although a plurality of mechanical members 105 are shown in FIG. 7, in some embodiments, a single mechanical member 105 may be coupled to the exterior of enclosure 101, with multiple inductor coils 204A/204B internal to enclosure 101 and adjacent to the single mechanical member 105. As so constructed pursuant to FIG. 7 and this paragraph, the arrangement of mechanical member(s) 105 and inductor coils 204A/204B may enable positional sensing of force (e.g., the location on enclosure 101 in which a user is physically interacting).

Although FIG. 7 depicts mechanical member(s) 105 and inductor coils 204A/204B along one side of enclosure 101, in some embodiments, mechanical member(s) 105 and inductor coils 204A/204B may be placed along opposite sides of enclosure 101. Using such approach, sensors on opposite sides of enclosure 101 may sense force applied across the enclosure 101, such as "squeezing."

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. An apparatus for use in inductive-based sensing comprising:
   an inductor comprising:
      a plurality of inductor coils comprising a plurality of first inductor coils and a plurality of second inductor coils, each inductor coil comprising a spiraling wire of electrically-conductive material wherein the wire of electrically-conductive material is arranged substantially in a plane;
      wherein the plurality of first inductor coils and the plurality of second inductor coils are electrically coupled to one another and arranged with respect to one another such that:
         within the plane, electrical current flowing through the inductor flows clockwise in the first inductor coils;
         within the plane, electrical current flowing through the inductor flows counterclockwise in the second inductor coils;
         each first inductor coil is adjacent to at least one second inductor coil; and
         each second inductor coil is adjacent to at least one first inductor coil; and
   one or more mechanical members, arranged proximate to a respective one of the plurality of inductor coils such that displacement of the one or more mechanical members resulting from an occurrence of a physical interaction associated with a human-machine interface associated with the one or more mechanical members causes a change in an effective impedance of the inductor.

2. The apparatus of claim 1, wherein the plurality of inductor coils are arranged in a linear array, such that the plurality of inductor coils are electrically coupled to one another in an alternating pattern of first inductor coils and second inductor coils in a linear direction such that a single imaginary line crosses substantially through the center of each of the plurality of inductor coils.

3. The apparatus of claim 2, the apparatus further comprising:
   an enclosure, wherein the linear array is arranged on one side of the enclosure; and
   a second linear array arranged on an opposite side of the enclosure from the linear array, the second linear array comprising a plurality of second inductor coils electrically coupled to one another in an alternating pattern of first inductor coils and second inductor coils in a linear direction such that a second single imaginary line crosses substantially through the center of each of the plurality of second inductor coils, such that together the linear array and second linear array are configured to sense a force applied across the enclosure.

4. The apparatus of claim 2, the apparatus further comprising a second linear array of a plurality of second inductor coils electrically coupled to one another in an alternating pattern of first inductor coils and second inductor coils in a linear direction such that a second single imaginary line crosses substantially through the center of each of the plurality of second inductor coils, wherein the second linear array and the linear array are placed in proximity to one another.

5. The apparatus of claim 1, wherein the plurality of inductor coils are arranged in a matrix array, such that the plurality of inductor coils are electrically coupled to one another in a two-dimensional alternating checkerboard pattern of first inductor coils and second inductor coils.

6. The apparatus of claim 5, further comprising a second matrix array of a plurality of second inductor coils, such that the plurality of inductor coils are electrically coupled to one another in a two-dimensional alternating checkerboard pattern of first inductor coils and second inductor coils, wherein the second matrix array and the matrix array are placed in proximity to one another.

7. The apparatus of claim 1, wherein the physical interaction comprises one of pressing of a virtual interface by a user of a device comprising the apparatus and releasing of a virtual interface by the user of the device comprising the apparatus.

8. The apparatus of claim 1, wherein the one or more mechanical members each comprises a metal plate.

9. A method comprising:
   forming an inductor comprising:
      a plurality of inductor coils comprising a plurality of first inductor coils and a plurality of second inductor coils, each inductor coil comprising a spiraling wire of electrically-conductive material wherein the wire of electrically-conductive material is arranged substantially in a plane;
      wherein the plurality of first inductor coils and the plurality of second inductor coils are electrically coupled to one another and arranged with respect to one another such that:
         within the plane, electrical current flowing through the inductor flows clockwise in the first inductor coils;
         within the plane, electrical current flowing through the inductor flows counterclockwise in the second inductor coils;
         each first inductor coil is adjacent to at least one second inductor coil; and
         each second inductor coil is adjacent to at least one first inductor coil; and
   placing one or more mechanical members proximate to the inductor, such that the one or more mechanical members are arranged proximate to the plurality of inductor coils such that displacement of the one or more mechanical members resulting from an occurrence of a physical interaction associated with a human-machine interface associated with the one or more mechanical members causes a change in an effective impedance of the inductor.

10. The method of claim 9, further comprising arranging the plurality of inductor coils in a linear array, such that the plurality of inductor coils are electrically coupled to one another in an alternating pattern of first inductor coils and second inductor coils in a linear direction such that a single imaginary line crosses substantially through the center of each of the plurality of inductor coils.

11. The method of claim 10, further comprising:
providing an enclosure;
arranging the linear array on one side of the enclosure; and
arranging a second linear array on an opposite side of the enclosure from the linear array, the second linear array comprising a plurality of second inductor coils electrically coupled to one another in an alternating pattern of first inductor coils and second inductor coils in a linear direction such that a second single imaginary line crosses substantially through the center of each of the plurality of second inductor coils, such that together the linear array and second linear array are configured to sense a force applied across the enclosure.

12. The method of claim 10, further comprising arranging a second linear array in proximity to the linear array, the second linear array comprising a plurality of second inductor coils electrically coupled to one another in an alternating pattern of first inductor coils and second inductor coils in a linear direction such that a second single imaginary line crosses substantially through the center of each of the plurality of second inductor coils.

13. The method of claim 9, further comprising arranging the plurality of inductor coils in a matrix array, such that the plurality of inductor coils are electrically coupled to one another in a two-dimensional alternating checkerboard pattern of first inductor coils and second inductor coils.

14. The method of claim 13, further comprising arranging a second matrix array in proximity to the matrix array, the second matrix array comprising a plurality of second inductor coils, such that the plurality of inductor coils are electrically coupled to one another in a two-dimensional alternating checkerboard pattern of first inductor coils and second inductor coils.

15. The method of claim 9, wherein the physical interaction comprises one of pressing of a virtual interface by a user of a device comprising the apparatus and releasing of a virtual interface by the user of the device comprising the apparatus.

16. The method of claim 9, wherein the one or more mechanical members each comprises a metal plate.

17. A method comprising:
sensing a change in effective impedance of an inductor, the inductor comprising:
a plurality of inductor coils comprising a plurality of first inductor coils and a plurality of second inductor coils, each inductor coil comprising a spiraling wire of electrically-conductive material wherein the wire of electrically-conductive material is arranged substantially in a plane;
wherein the plurality of first inductor coils and the plurality of second inductor coils are electrically coupled to one another and arranged with respect to one another such that:
within the plane, electrical current flowing through the inductor flows clockwise in the first inductor coils;
within the plane, electrical current flowing through the inductor flows counterclockwise in the second inductor coils;
each first inductor coil is adjacent to at least one second inductor coil; and
each second inductor coil is adjacent to at least one first inductor coil; and
wherein one or more mechanical members are proximate to the inductor, such that each of the plurality of mechanical members are arranged proximate to the plurality of inductor coils such that displacement of the one or more mechanical members resulting from an occurrence of a physical interaction associated with a human-machine interface associated with the one or more mechanical members causes a change in an effective impedance of the inductor.

\* \* \* \* \*